United States Patent [19]
Iida

[11] Patent Number: 6,008,747
[45] Date of Patent: Dec. 28, 1999

[54] DIGITAL-TO-ANALOG CONVERTER WITH CURRENT SOURCE CENTRALLY LOCATED BETWEEN A PLURALITY OF CURRENT MIRRORS

[75] Inventor: Jun Iida, Kanagawa, Japan

[73] Assignee: Rohm Co., Ltd., Kyoto, Japan

[21] Appl. No.: 09/102,539

[22] Filed: Jun. 22, 1998

[30] Foreign Application Priority Data

Sep. 5, 1997 [JP] Japan .................................. 9-257731

[51] Int. Cl.[6] .................................................. H03M 1/00
[52] U.S. Cl. ........................................... 341/135; 323/315
[58] Field of Search .................................. 341/126, 127, 341/135, 136, 144, 145; 327/53, 66, 538, 543; 323/315

[56] References Cited

U.S. PATENT DOCUMENTS

| | | | |
|---|---|---|---|
| 5,057,838 | 10/1991 | Tsuji et al. .................................. | 341/133 |
| 5,394,080 | 2/1995 | Rijns .................................. | 323/315 |
| 5,446,457 | 8/1995 | Ryat .................................. | 341/136 |
| 5,680,038 | 10/1997 | Fieldler .................................. | 323/315 |
| 5,703,586 | 12/1997 | Tucholski .................................. | 341/144 |
| 5,892,471 | 4/1999 | Mahant-Shetti et al. .................................. | 341/135 |

*Primary Examiner*—Brian Young
*Assistant Examiner*—Peguy JeanPierre
*Attorney, Agent, or Firm*—Majestic, Parsons, Siebert & Hsue P.C.

[57] ABSTRACT

A D/A converter has one single input transistor used in common with a plurality of output transistors to together form current mirrors, and a decoder serves to sequentially select the current mirrors in response to a digital input, causing to generate a corresponding analog output from currents from selected ones of the current mirrors. The commonly used input transistor is centrally located with respect to the current mirrors such that the difference between the maximum and minimum distances, or that between the maximum and minimum parasitic resistances, between the input transistor used in common and the output transistors is reduced and the conversion characteristic can be improved.

13 Claims, 6 Drawing Sheets

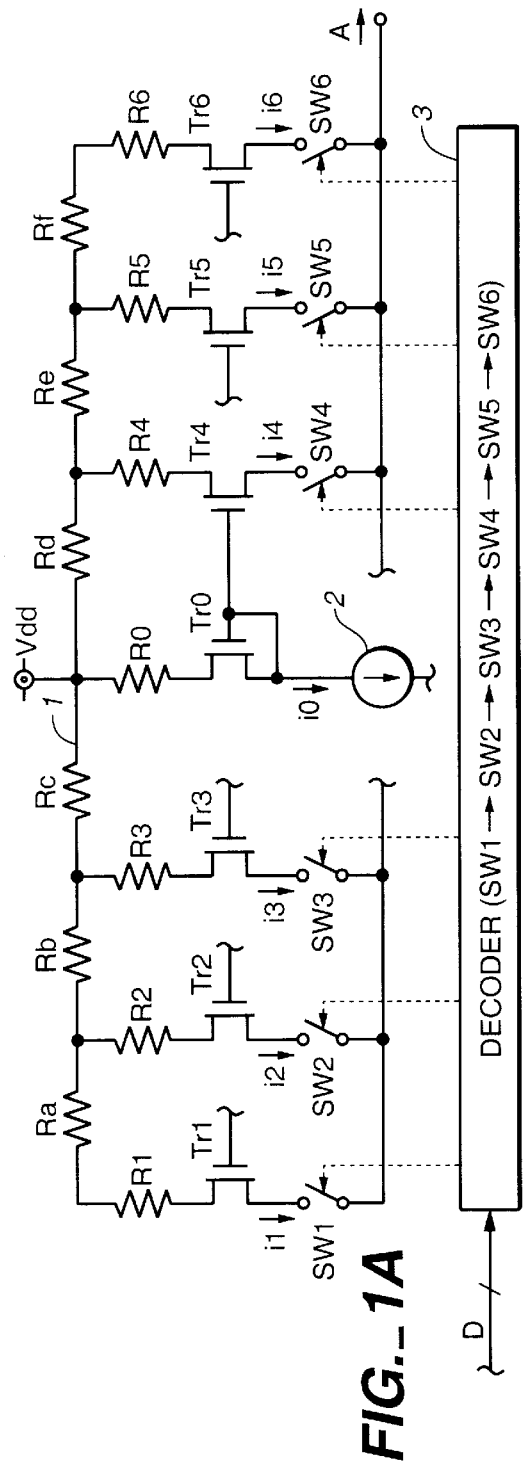
FIG._1A
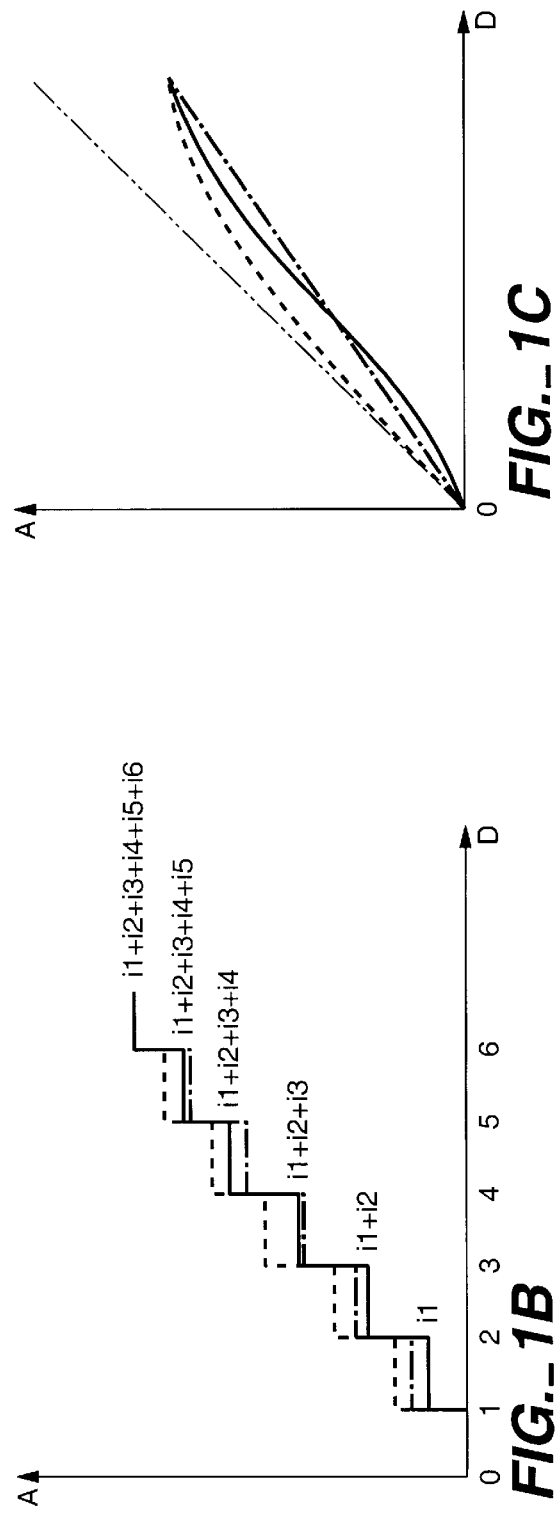
FIG._1B
FIG._1C

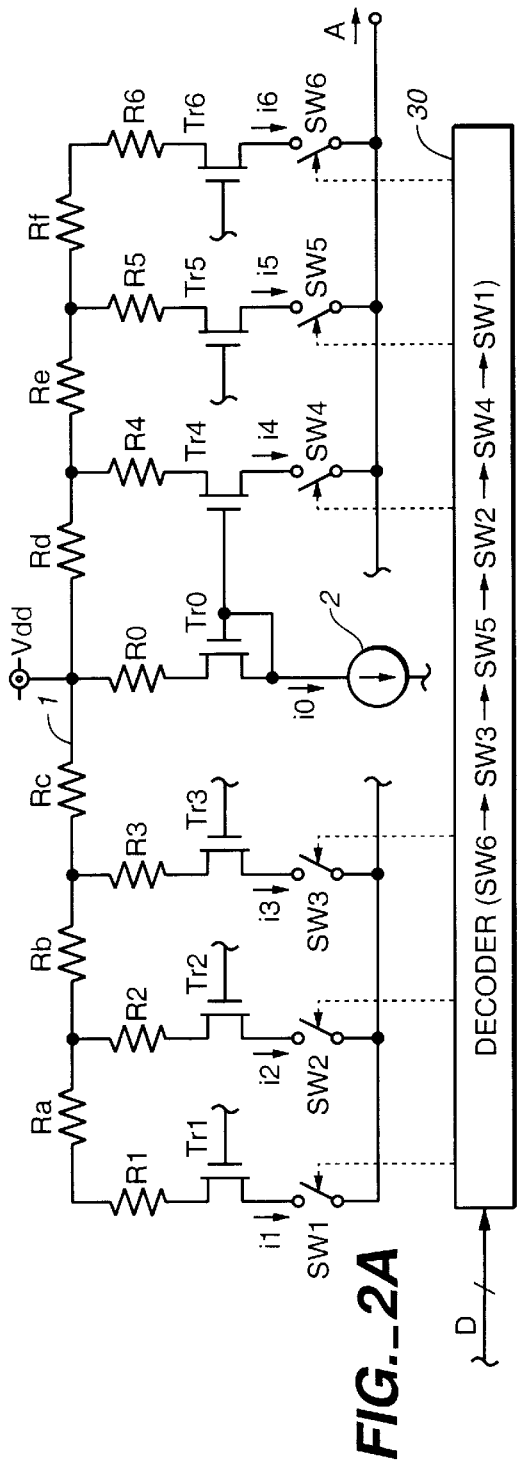
FIG._2A
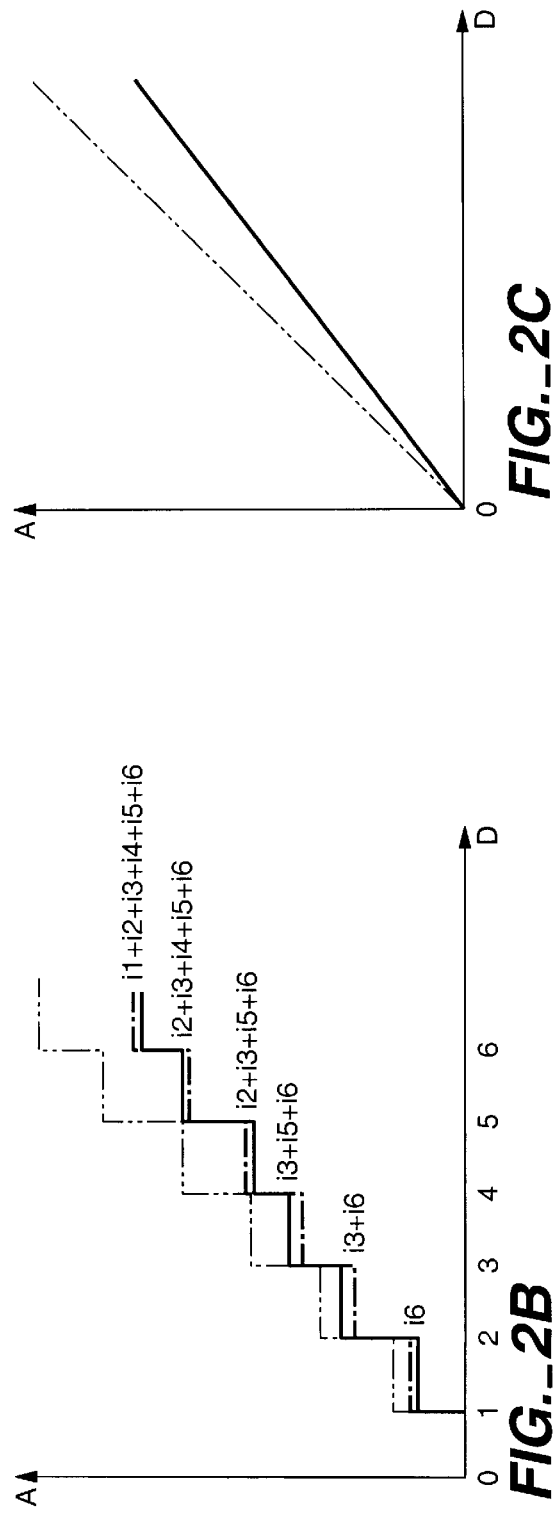
FIG._2B
FIG._2C

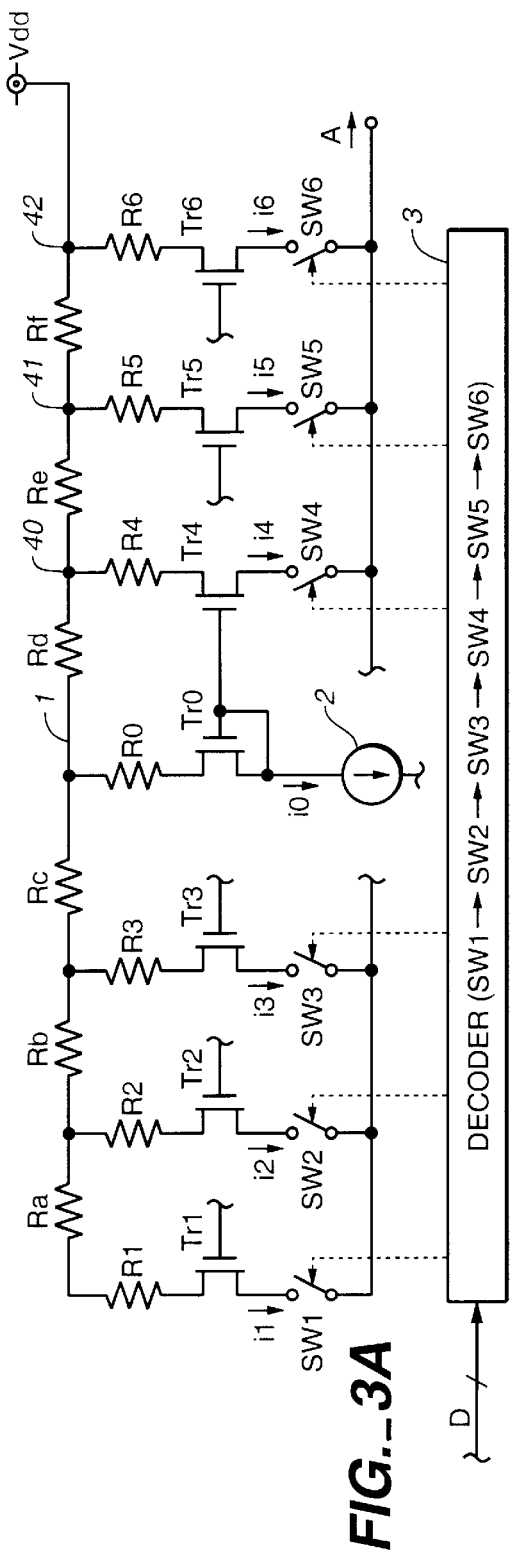
FIG._3A
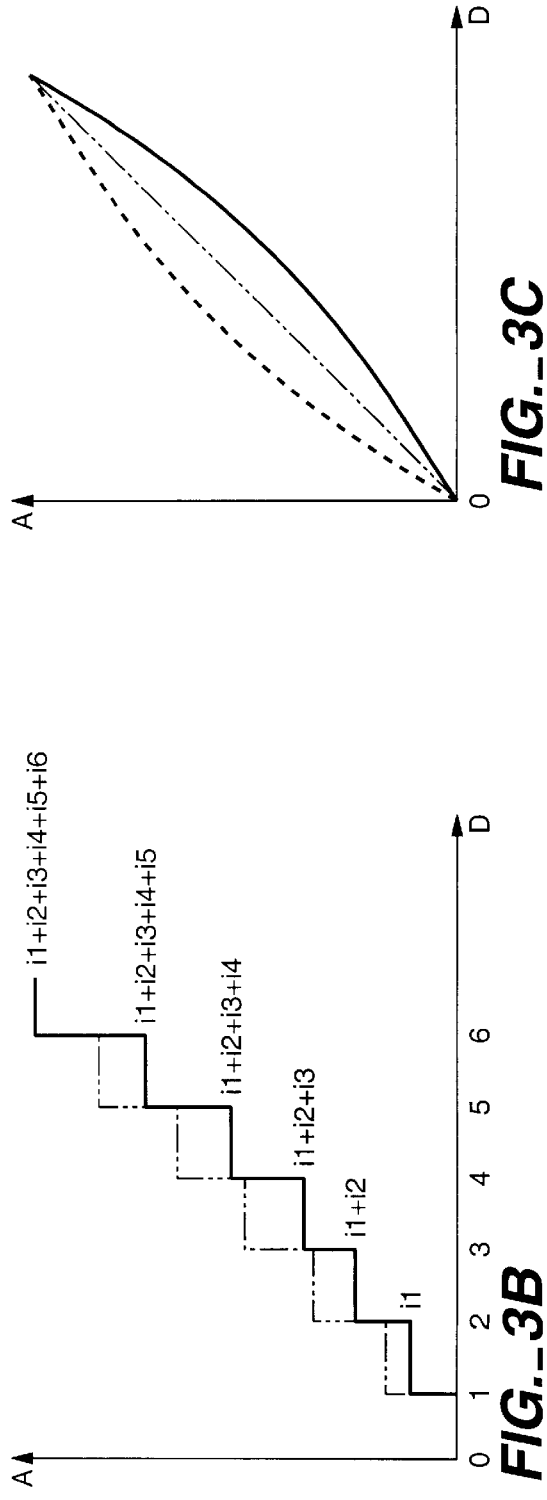
FIG._3B
FIG._3C

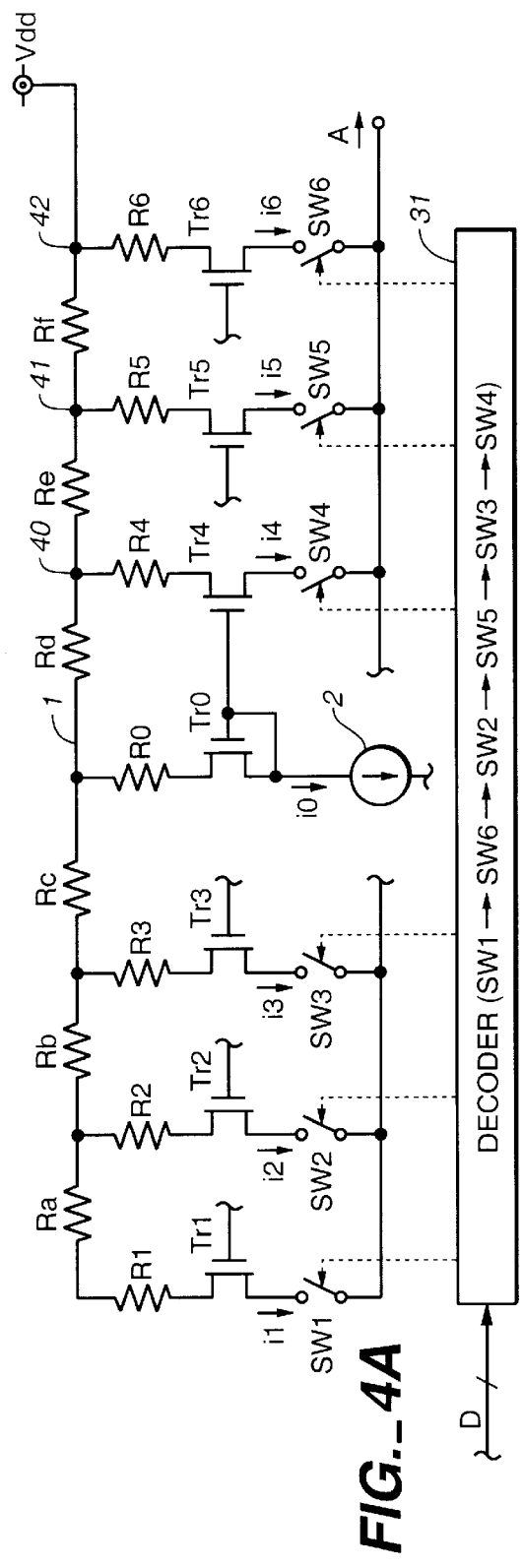
FIG._4A
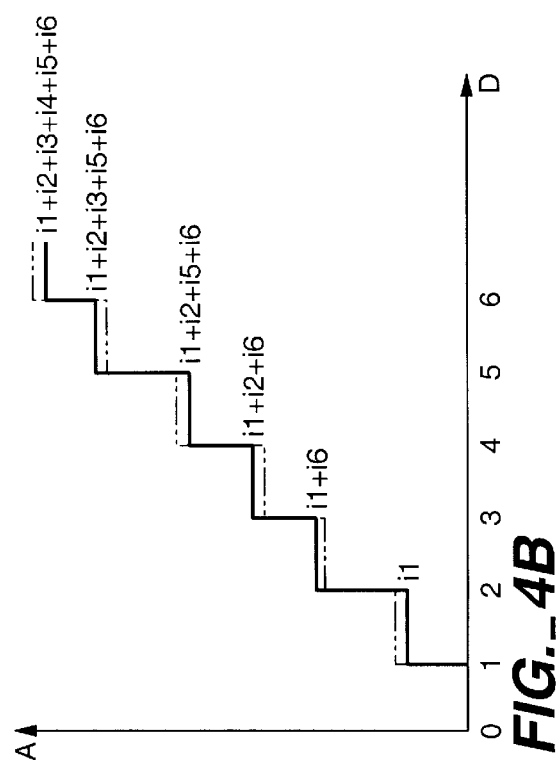
FIG._4B
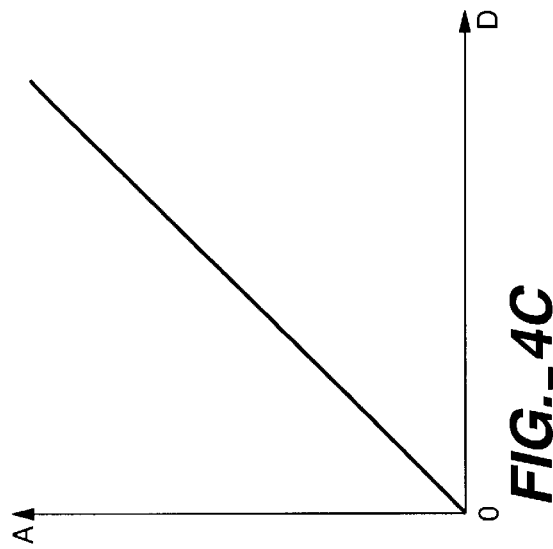
FIG._4C

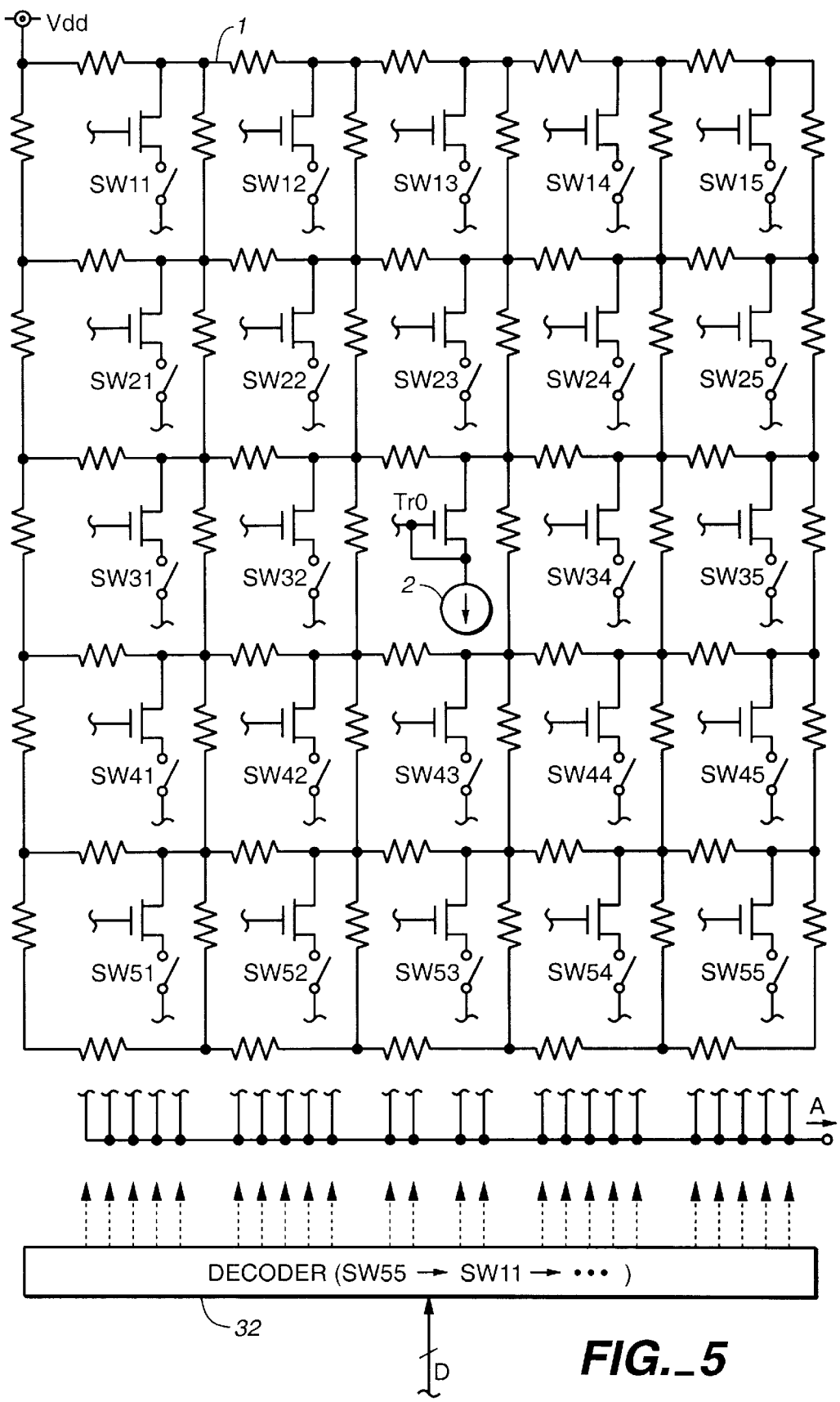
FIG._5

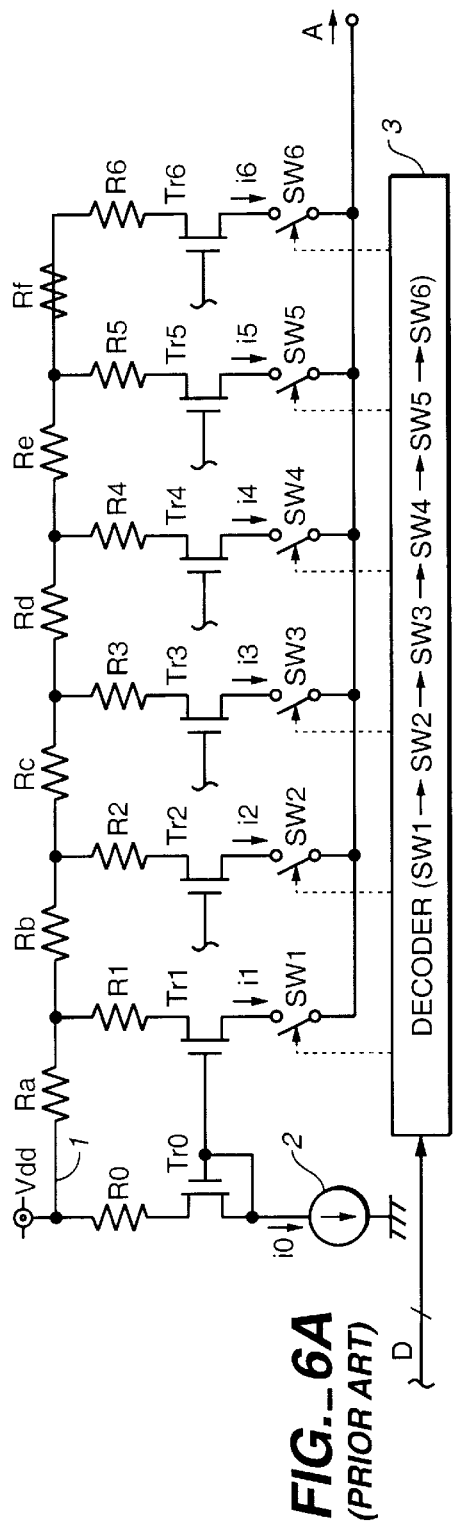
FIG._6A *(PRIOR ART)*
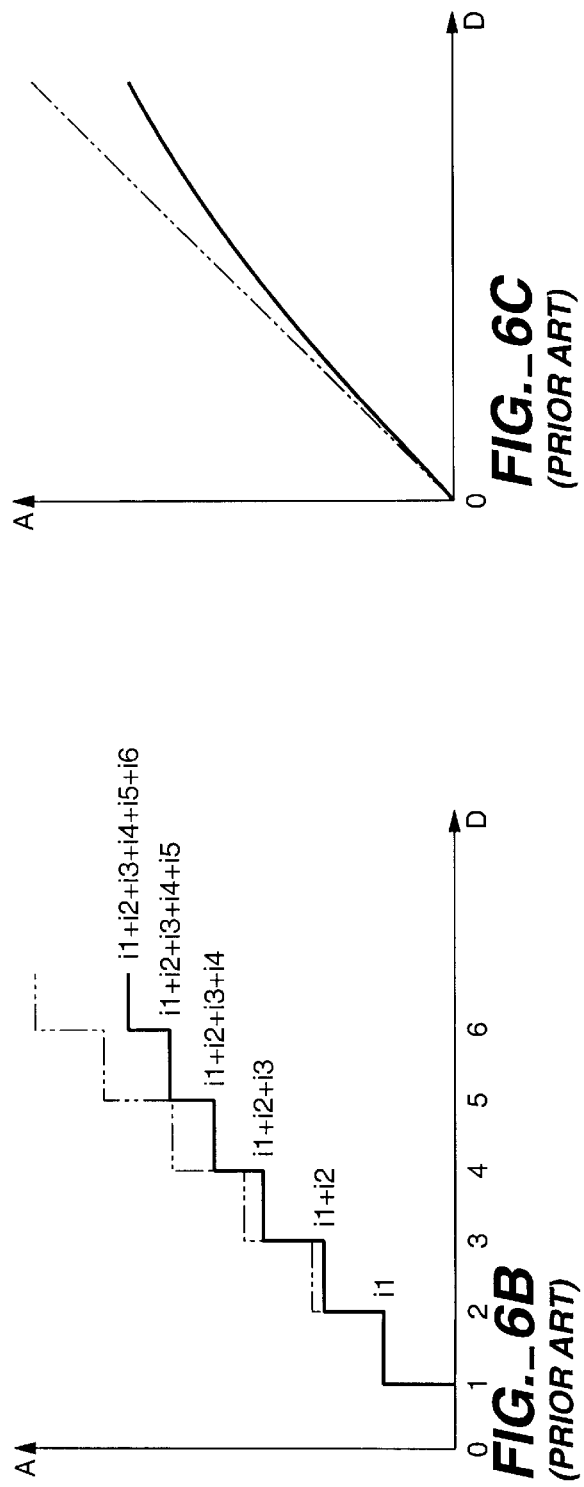
FIG._6C *(PRIOR ART)*
FIG._6B *(PRIOR ART)*

DIGITAL-TO-ANALOG CONVERTER WITH CURRENT SOURCE CENTRALLY LOCATED BETWEEN A PLURALITY OF CURRENT MIRRORS

BACKGROUND OF THE INVENTION

This invention relates to a digital-to-analog (D/A) converter of the current cell type comprising a plurality of current mirrors and selecting means therefor. More particularly, this invention relates to such a D/A converter formed by taking into consideration the effects of parasitic resistances of conductive lines through which power is supplied to the current mirrors.

FIG. 6A shows, for illustration, the circuit structure of a prior art D/A converter of the current cell type having six current mirrors, or six pairs of transistors Tr0+Tr1, Tr0+Tr2, Tr0+Tr3, Tr0+Tr4, Tr0+Tr5 and Tr0+Tr6, and a decoder (selecting means) 3 for decoding a digital input D and generating and outputting selection signals to the current mirrors. As an analog output A is generated corresponding to the digital input D by totaling output currents from those of the transistors Tr1–Tr6 selected by the selection signals, output currents i1–i6 of the plurality of current mirrors are selected to form the analog output A according to the digital input D.

Explained more in detail, transistor Tr0 is a MOS transistor on the input side of the current mirrors, its drain being connected to a power source line 1, its source being connected to a constant current source 2 for a reference current i0 and its gate being connected to the gates of the transistors Tr1–Tr6. In other words, transistor Tr0 serves as an input transistor for providing a constant reference current.

Transistor Tr1 is a MOS transistor on the output side of one of the current mirrors. Its drain is connected to the power source line 1, and its source, through which mirror current i1 flows, is connected through a switch SW1 to an output line for the analog output A. Transistor Tr2, too, is a MOS transistor on the output side of a current mirror, its drain being connected to the power source line 1 and its source, through which mirror current i2 flows, being connected through another switch SW2 to the output line for the analog output A. The other transistors Tr3–Tr6 may be similarly described, each being a MOS transistor on the output side of a corresponding current mirror, the drain of each being connected to the power source line 1 and the source of each being connected through a corresponding one of switches SW3–SW6 to the output line for the analog output A and having a corresponding mirror current i3, i4, i5 or i6 to flow therethrough. In summary, transistors Tr1–Tr6 are all transistors on the output side, having the same transistor (Tr0) in common on the input side. The aforementioned plurality of pairs of transistors Tr0+Tr1, Tr0+Tr2, Tr0+Tr3, Tr0+Tr4, Tr0+Tr5 and Tr0+Tr6 form a partially overlapping plurality of current mirrors, and their output currents i1–i6 may or may not be included in the analog output A, depending on whether the corresponding switches SW1–SW6 are in the conductive or closed (ON) condition or in the cut-off or open (OFF) condition.

The decoder 3 serves to switch on by simple means a suitable number of the switches SW1–SW6 corresponding to the digital input D while the selection signals to the current mirrors, or their ON and OFF conditions, are controlled. As the value of the digital input D increases from "0" sequentially to "1", "2", "3", "4", "5" and "6", for example, the decoder 3 switches on switches SW1, SW2, SW3, SW4, SW5 and SW6 from OFF to ON positions at each of the corresponding points in time. Similarly, when the value of the digital input D decreases, these switches are switched off from the ON to OFF positions in the reverse order. In other words, the decoder 3 usually selects the output transistors in the order of their proximity to the input transistor Tr0 when the digital input D increases (and in the reverse order when the digital input D decreases).

If each current mirror of such a D/A converter functioned ideally, the currents i1–i6 would be all equal, and the current values i1, i1+i2, i1+i2+i3, . . . , i1+i2+i3+i4+i5+i6 of the analog output A corresponding to the values of digital input D "0", "1", "2", . . . "6" would form a step function curve with equal steps, as shown by two-dot dashed line in FIG. 6B. In the case of a D/A converter of a similar structure with an increased number of current mirrors corresponding to an increased number of bits for the digital input D, the input-output curve would become a straight line with a constant slope, as shown by a two-dot dashed line in FIG. 6C.

In reality, however, the power source line 1 has parasitic resistance and the current which flows therethrough is fairly large. Thus, unless the resistance of the power source line 1 can be reduced to a negligible level, the conversion characteristic of the D/A converter is significantly different from the ideal situation described above.

What is herein referred to as the power source line 1 actually includes not only the line from the power supply terminal of the source voltage Vdd to the transistor Tr0 on the input side but also the first branch line branching therefrom and reaching the first transistor Tr1, the second branch line branching from the first branch line and reaching the second transistor Tr2, and so on to the last branch line branching from the penultimate branch line and reaching the last transistor Tr6. In other words, resistances Ra–Rf and R0–R6 are parasitically distributed among the lead lines as shown in FIG. 6A such that the currents i1–i6 are not all equal but tend to sequentially decrease, or i1>i2>i3>i4>i5>i6. As a result, the input-output characteristic of such a D/A converter is usually a step function curve with unequal steps (as shown by a solid line in FIG. 6B). In the case of such a D/A converter with an increased number of bits for the digital input D, the deviation from the ideal situation becomes greater as the value increases as shown by a solid line in FIG. 6C.

Japanese Patent Publication Tokkai 7-154260 disclosed a method of counteracting such ill effects of parasitic resistances in conductive lines. According to this technology, the power source terminal and each conductive line are duplicated such that the output currents from the individual current mirrors can be uniformized and a layout is made such that the sums of the lengths of the paths will become equal.

This method, however, cannot solve the problem for all cases because there are situations wherein it is difficult to duplicate the power source terminal or the conductive lines. There may also be situations wherein, although such duplication is not impossible to carry out, it is still not desirable to increase the number of power source terminals or the area for the wiring or the layout of the wiring may be difficult. Thus, it is not desirable to resort to such a conventional duplication method just in order to counteract the ill-effects of parasitic resistances of the conductive lines on the conversion characteristic.

For D/A converters to be mounted to an LSI circuit, limitations on the design become severer regarding the number of terminals, the area for the wiring and the layout as a whole because LSI circuits are requires to be miniaturized and highly integrated.

SUMMARY OF THE INVENTION

It is therefore an object of this invention to provide D/A converters with superior conversion characteristic without necessarily increasing the number of power-supplying points.

A D/A converter embodying this invention, with which the above and other objects can be accomplished, may be characterized not only as comprising one single input transistor and a plurality of output transistors to together form current mirrors and a decoder serving as a selecting means for sequentially selecting these current mirrors in response to a digital input but wherein this single input transistor is centrally located with respect to the output transistors. The purpose of thus centrally disposing the input transistor is to uniformize as much as possible the resistances which are parasitic to conductive lines connecting to the individual current mirrors. Thus, if the single input transistor which is used in common by all these current mirrors is centrally located, the difference between the maximum and minimum distances between this input transistor and the plurality of output transistors is reduced. Since the parasitic resistance of conductive lines between two transistors increases generally proportionally to the distance therebetween, this means that the difference between the maximum and minimum parasitic resistances between the input transistor and the output transistors can also be reduced by centrally disposing the input transistor.

In another aspect of this invention, the decoder, which serves as the selecting means for sequentially selecting the plurality of current mirrors to be switched on or off as the digital input is sequentially increased or decreased, is so programmed as to select alternately an output transistor which is relatively far from the input transistor and another which is relatively near to the input transistor, instead of in the order of their separations from the input transistor. With the decoder thus operated, the curve of conversion characteristic becomes more straight than if the selection were made in the order of distance because relatively large and relatively small mirror currents are alternately selected and added to form the analog output.

If the output transistors are divided into two groups such that those of the output transistors of one of the groups are all connected to a power source line sequentially on one side of a middle point at which the input transistor is connected while those of the output transistors of the other of the groups are all connected to the power source line sequentially on the opposite side, the decoder may be preferably so operated that output transistors of different groups are alternately selected to be switched on or off, as the digital input is sequentially increased or decreased. The conductive lines which connect the input transistor with the output transistors may be in a lattice formation with the single input transistor connected to a central lattice.

With a D/A converter thus structured, ill-effects of the parasitic resistances on the conductive lines connecting the input and output transistors can be minimized and the conversion characteristic can be improved.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1A is a circuit diagram of a D/A converter according to a first embodiment of this invention, FIG. 1B is its input-output characteristic, and FIG. 1C is the input-output characteristic when the number of bits for the digital input is increased;

FIG. 2A is a circuit diagram of a D/A converter according to a second embodiment of this invention, FIG. 2B is its input-output characteristic, and FIG. 2C is the input-output characteristic when the number of bits for the digital input is increased;

FIG. 3A is a circuit diagram of a D/A converter according to a third embodiment of this invention, FIG. 3B is its input-output characteristic, and FIG. 3C is the input-output characteristic when the number of bits for the digital input is increased;

FIG. 4A is a circuit diagram of a D/A converter according to a fourth embodiment of this invention, FIG. 4B is its input-output characteristic, and FIG. 4C is the input-output characteristic when the number of bits for the digital input is increased;

FIG. 5 is a circuit diagram of a portion of a D/A converter according to a fifth embodiment of this invention; and FIG. 6A is a circuit diagram of a prior art D/A converter, FIG. 6B is its input-output characteristic, and FIG. 6C is the conversion characteristic when the number of bits for the digital input is increased.

Throughout herein like and corresponding components are indicated by numerals which are the same or related and may not necessarily be explained repetitiously.

DETAILED DESCRIPTION OF THE INVENTION

FIG. 1A shows a D/A converter according to a first embodiment of this invention, which is different from the prior art D/A converter described above with reference to FIG. 6A wherein the input transistor Tr0, as well as the conductive lines from the steady-current source 2 and the power source Vdd which are directly connected thereto, is moved from the left-hand side (with reference to FIG. 6A) of the first transistor Tr1 to a center position of the circuit between the third transistor Tr3 and the fourth transistor Tr4. More generally, the D/A converter according to this embodiment of the invention may be characterized as having the input transistor positioned at the center of a plurality of current mirrors.

As a result, the power source lines 1 to the output transistors Tr1–Tr6 of the current mirrors are divided into a right-hand side, portion and a left-hand side portion with respect to the input transistor Tr0 in common which is at the center. Thus, the parasitic resistances Ra–Rf and R0–R6 distributed over the power source lines 1 are also distributed to the right-hand side and to the left-hand side. The output currents i1–i6 from the transistors Tr1–Tr6 are now related as follows:

$$i3 \approx i4 > i2 \approx i5 > i1 \approx i6.$$

The difference between the largest and the smallest of these currents is only about a half of that in the case of the prior art D/A converter.

FIG. 1B shows (by a solid line) the input-output characteristic of the D/A converter explained above with reference to FIG. 1A, and FIG. 1C shows (by a solid line) a general characteristic curve when the number of bits has been increased. In both FIGS. 1B and 1C, the one-dot dashed line represents the situation where the increase is in equal steps.

As the value of the digital input D to the D/A converter of FIG. 1A increases from "0" sequentially to "1", "2", "3", "4", "5" and "6", the current intensity of the corresponding analog output A changes sequentially as i1, i1+i2, ..., i1+i2+i3+i4+i5+i6. As shown in FIG. 1B, this step-wise increase is not uniform. Compared to the step function curve with equal steps (shown by a one-dot dashed line in FIG. 1B), the step function curve shown in FIG. 1B by a solid line is lower when the value of the digital input D is low but catches up with the equal-step curve in the middle. It becomes higher thereafter but the two curves match each other once again for the highest input value. The same characteristics are also seen in FIG. 1C when the number of bits of the digital input is increased.

In summary, not only does the characteristic curve match the equal-step (or straight) curve when the digital input D is at a medium value but even the maximum difference becomes about one half Thus, the conversion characteristic of this D/A converter according to this invention is closer to be straight (shown by the one-dot dashed line in FIG. 1C) than that of the prior art D/A converter (shown by a solid line in FIG. 6C and reproduced by a broken line in FIG. 1C). For comparison, the two-dot dashed line of FIG. 6C is also shown in FIG. 1C.

FIG. 2A shows another D/A converter according to a second embodiment of this invention which is similar to the D/A converter described above with reference to FIG. 1A but different therefrom wherein the decoder 3 in the first embodiment is replaced by another decoder 30 adapted to switch on and off the switches SW1–SW6 in a different order. As the value of the digital input D is increased from "0" sequentially to "1", "2", "3", "4", "5" and "6", this decoder 30 switches on the switches SW1–SW6 in the order of SW6, SW3, SW5, SW2, SW4 and SW1 from the OFF position to the ON position at each point in time of the increase in the digital input D. When the value of the digital input D is decreased, the switches SW1–SW6 are switched off from the ON position to the OFF position in the reverse order. In other words, as the value of the digital input D is sequentially increased or decreased, those of the output transistors Tr1–Tr6 closer to the input transistor Tr0 and farther away therefrom are alternately selected to be switched on or off.

Thus, if the value of the digital input D is increased from "0" sequentially to "1", "2", "3", "4", "5" and "6", the corresponding analog output A (or the value of the outputted total current from this D/A converter) changes sequentially as i6, i3+i6, i3+i5+i6, i2+i3+i5+i6, i1+i2+i3+i5+i6 and i1+i2+i3+i4+i5+i6, as shown by a solid line in FIG. 2B. Compared to the curve with equal steps (shown by a one-dot dashed line again in FIG. 2B), each step of the solid line is alternately above and below by only a slight difference. If the number of the current mirrors is increased according to an increase in the number of bits of the digital input D, the height difference at each step becomes smaller and the conversion characteristic of the D/A converter becomes nearly straight as shown in FIG. 2C by a solid line. The two-dot dashed lines in FIGS. 2B and 2C are the same as those in FIGS. 6B and 6C, shown for comparison.

FIG. 3A shows still another D/A converter according to a third embodiment of this invention which is similar to the D/A converter according to the first embodiment described above with reference to FIG. 1A but different therefrom wherein the power supply point (at which the source voltage Vdd is applied) is moved to the right-hand end (with reference to FIGS. 1A and 3A), that is, next to the last transistor Tr6. As a result, one half of the branch points of the conductive lines leading to the output transistors Tr1–Tr6 of the plurality of current mirrors (indicated by numerals 40, 41 and 42) are now found on the conductive line connecting the power supply terminal with the input transistor Tr0. As a result, the conductive lines to the transistors Tr4–Tr6 connected to these branch points 40, 41 and 42 are characterized as having a smaller parasitic resistance than that of the conductive line to the input transistor Tr0. Thus, the output currents i4–i6 from these transistors Tr4–Tr6 are increased. If the ideal amplification ratio of the current mirror is n, the following relationship exists among the output currents i1–i6 from the transistors Tr1–Tr6: i1<i2<i3<(i0×n)<i4<i5<i6.

FIG. 3B shows with a solid line the input-output characteristic of this D/A converter and FIG. 3C shows its conversion characteristic when the number of bits for the digital input D is increased. When the digital input D is increased and reaches its maximum value "6", the current intensity i1+i2+i3+i4+i5+i6 for the corresponding analog output A is approximately equal to i0×n×6, or the ideal maximum value at the time of its designing because the decreased in currents i1–i3 and the increases in current i4–i6 cancel each other. The two-dot dashed line of FIG. 3B is the same two-dot dashed line of FIG. 6B, shown for comparison.

With this D/A converter, the analog output is lower when the digital input D is of an intermediate value, as can be seen more clearly by a two-dot chain line in FIG. 3C. If the power supply point at which the source voltage Vdd is applied is moved instead to the left-hand (with reference to FIGS. 1A and 3A), that is, next to the first transistor Tr1 if the order of selection by the decoder 3 is reversed so as to be SW6→SW5→SW4→SW3→SW2→SW1, the conversion characteristic (shown by dotted line in FIG. 3C) is above the two-dot dashed line.

FIG. 4A shows still another D/A converter according to a fourth embodiment of this invention which is similar to the D/A converter according to the third embodiment described above with reference to FIG. 3A but different therefrom wherein the decoder 3 shown in FIG. 3A is replaced by another decoder 31 adapted to switch on and off the switches SW1–SW6 in still another different order. As the value of the digital input D is increased from "0" sequentially to "1", "2", "3", "4", "5" and "6", this decoder 31 switches on the switches SW1–SW6 in the order of SW1, SW6, SW2, SW5, SW3 and SW4 from the OFF position to the ON position at each point in time of the increase in the digital input D. When the value of the digital input D decreases, the switches SW1–SW6 are switched off in the reverse sequence. In other words, as the value of the digital input D is sequentially increased, those of the output transistors Tr1–Tr6 closer to the input transistor Tr0 and farther away therefrom are alternately selected, that is, SW1→SW6→SW2→SW5→SW3→SW4 to be switched on.

Thus, if the value of the digital input D is increased from "0" sequentially to "1", "2", "3", "4", "5" and "6", the corresponding analog output A (or the value of the outputted total current from this D/A converter) changes sequentially as i1, i1+i6, i1+i2+i6, i1+i2+i5+i6, i1+i2+i3+i5+i6 and i1+i2+i3+i4+i5+i6, as shown by a solid line in FIG. 4B. Compared to the "ideal" curve with equal steps as intended at the time of its designing (shown by a two-dot dashed line in FIG. 4B), each step of the solid line is alternately above and below by only a slight difference. If the number of the current mirrors is increased according to an increase in the number of bits of the digital input D, the height difference at each step becomes smaller and the conversion characteristic of the D/A converter becomes a nearly straight line as shown in FIG. 4C, having the intended slope.

In summary, D/A converters according to this invention can be easily designed and structured so as to have a desired conversion characteristic without increasing the area for wiring or the number of power supply points.

FIG. 5 shows still another D/A converter according to a fifth embodiment of this invention, which is different from the D/A converter shown in FIG. 4A firstly in that the input and output transistors are arranged in a matrix formation with 5 rows and 5 lines, secondly in that the, power supply line 1 shown in FIG. 4A is replaced by power supply lines 1 in a lattice formation with each lattice having a corresponding one of the transistors attached thereto, thirdly in that the decoder 31 shown in FIG. 4A is replaced by still another decoder 32, and fourthly in that the power source terminal at which the source voltage Vdd is to be applied is at the top left-hand side (referring to FIG. 5) of the lattice formation. In summary, the conductive lines for this D/A converter for connecting the power supply terminal with the plurality of current mirrors are in a network formation.

The input transistor Tr0 in common for the current mirrors is at line 3, row 3 of the matrix formation, that is, attached to the center lattice of the power lines 1. The other lattice areas each correspond to a different one of the 24 output transistors Tr11–Tr55 (except Tr33) of the current mirrors. Each of the transistors is connected to a conductive line of the corresponding lattice in the same manner. In summary, the input transistor Tr0 is in the middle of a plurality of current mirrors whether seen in the row or line direction of the matrix formation and there are several branch points on the conductive line between the power supply point and the input transistor, each branch point connecting to the output transistor of one of the current mirrors.

The decoder 32 serves to sequentially switch on and off the switches SW11–SW55 (except SW33) as the digital input D increases and decreases, as explained above with reference to other embodiments of this invention but such that the D/A converter will exhibit an ideal conversion characteristic. For this purpose, the sequence of selection is preferably such that if one switch is selected, another switch at least approximately symmetrically opposite therefrom with respect to the center of the matrix formation be selected next (such as SW55→SW11→. . . ). If such a sequence is difficult, the next switch to be selected should be on the opposite side either in the row or line direction alone. If it is difficult to arrange the transistors in a strictly matrix formation as shown in FIG. 5, the distribution of the transistors and the arrangement of the conductive lines need not be exactly in a perfect lattice formation. In such a situation, the sequence of selection by the decoder is determined not necessarily on the basis of geometrical shape or distances but more importantly by considering the effective resistance of the conductive lines between the power source and each of the transistors.

In summary, D/A converters according to this invention are characterized as having conductive lines connecting the power source with the input and output transistors of a plurality of current mirrors arranged such that variations among the output currents from these current mirrors are minimized and that the conversion has improved linear characteristics.

What is claimed is:

1. A D/A converter comprising:

a plurality of current mirrors including one single input transistor and a plurality of output transistors each connected to said input transistor to form one of said current mirrors, said input transistor being centrally located with respect to said output transistors; and selecting means for selecting said current mirrors in a specified sequence in response to a received digital input and thereby generating an analog output corresponding to said digital input from currents outputted from said selected current mirrors.

2. The D/A converter of claim 1 wherein said output transistors are divided into two groups, those of said output transistors in each of said groups being connected to said input transistor sequentially such that the distance from said input transistor changes monotonically.

3. The D/A converter of claim 2 further comprising a conductive power source line, said input transistor being connected to a middle point on said power source line, those of said output transistors of one of said two groups being connected sequentially to different points on said power source line on one side of said middle point, and those of said output transistors of the other of said two groups being connected sequentially to different points on said output source line on the other side of said middle point.

4. The D/A converter of claim 3 wherein said selecting means selects alternately a farther one and a nearer one of said output transistors with respect to said input transistor than the previously selected one of said output transistors as said digital input is sequentially increased or decreased.

5. The D/A converter of claim 4 wherein said selecting means selects alternately one of said output transistors from one of said groups and another of said output transistor from the other of said groups as said digital input is sequentially increased or decreased.

6. The D/A converter of claim 3 wherein said selecting means selects alternately one of said output transistors from one of said groups and another of said output transistor from the other of said groups as said digital input is sequentially increased or decreased.

7. The D/A converter of claim 2 wherein said selecting means selects alternately a farther one and a nearer one of said output transistors with respect to said input transistor than the previously selected one of said output transistors as said digital input is sequentially increased or decreased.

8. The D/A converter of claim 7 wherein said selecting means selects alternately one of said output transistors from one of said groups and another of said output transistor from the other of said groups as said digital input is sequentially increased or decreased.

9. The D/A converter of claim 2 wherein said selecting means selects alternately one of said output transistors from one of said groups and another of said output transistor from the other of said groups as said digital input is sequentially increased or decreased.

10. The D/A converter of claim 1 further comprising conductive lines in a lattice formation with lattices, said input transistor being connected to a middle one of said lattices, said output transistors being each connected to an associated different one of said lattices.

11. The D/A converter of claim 10 wherein said selecting means selects alternately a farther one and a nearer one of said output transistors along said lattices with respect to said input transistor than the previously selected one of said output transistors as said digital input is sequentially increased or decreased.

12. The D/A converter of claim 11 wherein said selecting means selects alternately one of said output transistors and another of said output transistor on opposite side with respect to said input transistor as said digital input is sequentially increased or decreased.

13. The D/A converter of claim 10 wherein said selecting means selects alternately one of said output transistors and another of said output transistor on opposite side with respect to said input transistor as said digital input is sequentially increased or decreased.

* * * * *